United States Patent
Stine et al.

(10) Patent No.: US 10,656,204 B2
(45) Date of Patent: May 19, 2020

(54) FAILURE DETECTION FOR WIRE BONDING IN SEMICONDUCTORS

(71) Applicant: PDF Solutions, Inc., Santa Clara, CA (US)

(72) Inventors: Brian Stine, San Jose, CA (US);
Richard Burch, San Jose, CA (US);
Nobuchika Akiya, San Jose, CA (US)

(73) Assignee: PDF Solutions, Inc., Santa Clara, CA (US)

( * ) Notice: Subject to any disclaimer, the term of this patent is extended or adjusted under 35 U.S.C. 154(b) by 52 days.

(21) Appl. No.: 16/138,928

(22) Filed: Sep. 21, 2018

(65) Prior Publication Data

US 2019/0146032 A1    May 16, 2019

Related U.S. Application Data

(60) Provisional application No. 62/561,569, filed on Sep. 21, 2017.

(51) Int. Cl.
*G01R 31/28* (2006.01)
*G06F 11/00* (2006.01)
*G01R 31/3177* (2006.01)
*G06N 20/00* (2019.01)
*G01R 31/317* (2006.01)
*G06N 3/04* (2006.01)
(Continued)

(52) U.S. Cl.
CPC ... *G01R 31/3177* (2013.01); *G01R 31/31717* (2013.01); *G06N 3/0454* (2013.01); *G06N 3/08* (2013.01); *G06N 20/00* (2019.01); *G06N 20/10* (2019.01)

(58) Field of Classification Search
CPC ....... G11C 5/04; G11C 29/025; G11C 29/702; G11C 29/18; G11C 2029/1802; H04L 1/243; H04L 1/244; H04L 12/2697; H04L 43/50; H04L 43/0847; H04L 43/18; H04L 43/06; H04L 49/9057; H04L 47/34; H04L 12/42; H04L 1/245; G01R 31/31716; G01R 31/31703; G01R 31/31813; G01R 31/3177; G01R 31/31717; G06F 11/221; G06F 11/2221; G06F 11/263; G06F 17/5081; H01L 2924/0002; H01L 22/22; H01L 2924/00; G06N 20/00; G06T 7/0004
See application file for complete search history.

(56) References Cited

U.S. PATENT DOCUMENTS

| 6,865,578 B2 | 3/2005 | Hays |
| 2012/0022700 A1 | 1/2012 | Drees |

(Continued)

*Primary Examiner* — Guerrier Merant
(74) *Attorney, Agent, or Firm* — Pillsbury Winthrop Shaw Pittman LLP

(57) ABSTRACT

Disclosed is a system and method for collecting trace data of integrated circuits from the back-end assembly tools and using yield, reliability, and burn-in data to distinguish good circuit traces from bad ones. Described further is an system and method for implementing a heuristic mapping of trace data for distinguishing between good or bad traces in an Internet-based or offline application. The result of this detection can then be used for yield improvement or for burn-in reduction where for example burn-in chips having "good" circuit traces are subjected to thermal stress for less time than for chips identified as having "bad" circuit traces.

20 Claims, 6 Drawing Sheets

(51) Int. Cl.
*G06N 3/08* (2006.01)
*G06N 20/10* (2019.01)

(56) References Cited

U.S. PATENT DOCUMENTS

2018/0330493 A1* 11/2018 Milligan .............. G06T 7/0004
2019/0236240 A1* 8/2019 Huang ................ G06F 11/2221

* cited by examiner

FAILURE DETECTION FOR WIRE BONDING IN SEMICONDUCTORS

PRIORITY

This application claims priority to and expressly incorporates by reference the corresponding U.S. Provisional Patent Application No. 62/561,569, entitled "Method and Apparatus for Failure Detection and Correction (FDC) for Wire Bonding in Semiconductors," filed on Sep. 21, 2017.

CROSS REFERENCE TO RELATED PATENT APPLICATIONS

This application is related to U.S. Nonprovisional patent application Ser. No. 15/469,352 filed on Mar. 24, 2017, entitled "Advanced Manufacturing Insight System for Semiconductor Application," which claims priority to U.S. Provisional Patent Application No. 62/313,082 filed Mar. 24, 2016, entitled "Advanced Manufacturing Insight System for Semiconductor Application," each of which is expressly incorporated by reference in this disclosure and included hereto as attachments A and B, respectively.

BACKGROUND

The disclosure relates to apparatus and methods of using failure detection and correction ("FDC") data for yield, quality, and efficiency optimization in back-end assembly processes of semiconductor fabrication, and more specifically in the wire-bonding process in semiconductor fabrication. FIG. 1 illustrates a process for testing wire bonding according to the prior art, which includes after performing maintenance on the wire bonder (operation 102), testing the wire bonding on the IC chip (operation 104) using destructive testing and failure analysis (operation 106). The effectiveness of the result is then evaluated (operation 108) and if the test fails, the process repeats at operation 102. If the testing passes, the integrated circuit ("IC") chip can be released for production (operation 110).

An emerging challenge in the semiconductor packaging, assembly and testing is the pre-shipment quality and reliability control of various semiconductor parts. This is even more prevalent in the automotive industry. Many automotive manufacturers report semiconductor components as an ever-growing source of recalled parts. That is why many semiconductor module manufacturers and automotive manufacturers now demand an early phase failure detection of semiconductor components. However, the biggest challenge for the semiconductor manufacturers is early failure issues of the ICs due to poor wire bonding, soft shorts, etc.

Conventional methods of quality control for ICs include burn-in processes, in which, the ICs are packaged and then are put in a thermal chamber for several hours and further retested. These conventional processes however are not suitable for testing a high volume of ICs. As is appreciated by skilled persons in the art, a burn-in process is designed to stress the ICs in such a way that any bad ICs (or marginally bad) will usually fail under the testing. The ICs that pass the thermal test(s) are separated from the failed ICs. Only those ICs that pass the thermal test are shipped.

When the volume of the ICs is too high, minor failures may not be detected in the thermal test. Additionally, stringent burn-in processes are very costly. Detection and further classification of failed parts is also difficult to implement. The existing classification processes utilize data collection methods prone to noise, missed triggers, or any other uncontrollable parameter. As such conventional techniques are not very reliable. Therefore it becomes necessary to implement reliable analytical processes of classification.

Some IC fabrication facilities may further implement Advanced Process Control ("APC") for enhancing throughput, quality and stability at the same time. Some such APC methods include Pad Crack Detection for aluminum wire bonding. Further, while some IC fabrication facilities implement Advanced Process Control (APC) for enhancing throughput, quality and stability at the same time, these solutions are not suitable for calculating failure indicators or using machine learning to segregate normal and abnormal ICs in real time (on-the-fly) or in an offline manner. Nor do prior art solutions use FDC data for throughput improvement or burn-in reduction. Therefore, it would be beneficial to have a tool and a process to test the quality of the wire bonds and further to distinguish between normal and abnormal ICs based on the test results. It would also be advantageous to have a system to classify the abnormal ICs based on the failure indicators.

SUMMARY

Described herein are systems, methods and computer-readable media adapted for testing wire bonds of an IC chip in an assembly process. In one embodiment the innovative techniques described in this disclosure are implemented at a data collection system comprising a computer hardware server in communication with a database system over one or more computer networks and at least one network interface configured for receiving, over the computer network(s), a collection of failure detection data (such as e.g., FDC data) for one or more test samples of the IC chip obtained during wire bonding in the assembly process.

A failure detection process can be performed on the collection of failure detection data to evaluate the test samples of the IC chip. In at least certain embodiments, the failure detection process may include (1) training a machine learning algorithm using a training dataset comprising at least a portion of the collection of failure detection data stored in the database system (2) detecting one or more failure indicators in the test samples of the IC chip based on the collection of failure detection data using the trained machine learning algorithm (3) identifying circuit traces on a surface of each test sample of the IC chip as abnormal circuit traces when one or more failure indicators are detected (4) identifying circuit traces on the surface of each test sample of the IC chip as normal circuit traces when no failure indicators are detected and (5) identifying, by the machine learning algorithm, test samples of the IC chip that contain no traces identified as abnormal circuit traces as normal IC chips.

In one embodiment the trace data for the circuit traces identified as normal circuit traces can be stored into a file or data structure containing the IC chips identified as normal IC chips. The abnormal IC chips can thereafter be segregated or subjected to additional destructive tests to confirm proper functionality. The failure detection data can be new or updated as the system receives new or updated failure detection data over the computer network(s). The machine learning algorithm can then be used to classify the updated data as either normal trace data or abnormal trace data based on comparing it with the trace data for the normal IC chips stored in the file or data structure, which can be used for throughput improvement of the process or burn-in reduction.

In some cases manual destructive testing can be performed on a subset of the test samples of the IC chip in addition to the failure detection process. For example, the destructive testing may include a burn-in process in a thermal chamber adapted to stress the circuit traces in the test samples of the IC chip for failure analysis. The destructive testing can be skipped or reduced for the normal IC chips. The burn-in process can be reduced by applying the burn-in process to the normal IC chips for less time than for IC chips having abnormal circuit traces.

An apparatus and a method are described for collecting trace data of ICs from the back-end assembly tools, and using yield, reliability, and burn-in data (e.g., FDC data) to distinguish between good and bad circuit traces. Described further is a system and method of implementing heuristic mapping of trace data for good or bad traces in an Internet-based or offline application. The result of this detection can then be used for yield improvement or for burn-in reduction, e.g. chips which have normal traces can be exposed to the burn-in process for less time than for the chips having circuit traces identified as abnormal traces).

The data may also be used to improve the "up time" of a wire-bonding machine (referred to as a "wire bonder" in the art). Normally, when a wire bonder undergoes maintenance, several test chips can be bonded after the completion of maintenance. Those chips can then be destructively tested and manual failure analysis performed to ensure the bonds are "good". Unfortunately, this takes time and the wire bonder cannot be used during this time. By using failure detection data (e.g., FDC data) as taught in this disclosure, this time-consuming procedure may be skipped. The FDC test may performed on a test sample number of ICs. By observing the FDC data for the sample ICs, it may be determined whether the wire bonds are normal or abnormal. If they are normal (i.e., "good" circuit traces), the bonder can be released back into production skipping the lengthy manual destructive testing. If they are abnormal (i.e., "bad" circuit traces), the maintenance can be re-performed. Occasionally, the manual destructive testing is done in a sampled fashion in order to crosscheck the FDC-based method.

The following detailed description and accompanying drawings provide a better understanding of the nature and advantages of the innovative techniques described in this disclosure.

BRIEF DESCRIPTION OF THE DRAWINGS

The above aspects and other aspects and features will become apparent to those skilled in the art upon review of the following description in conjunction with the accompanying figures, wherein.

DETAILED DESCRIPTION OF THE EMBODIMENTS

Figure 1:
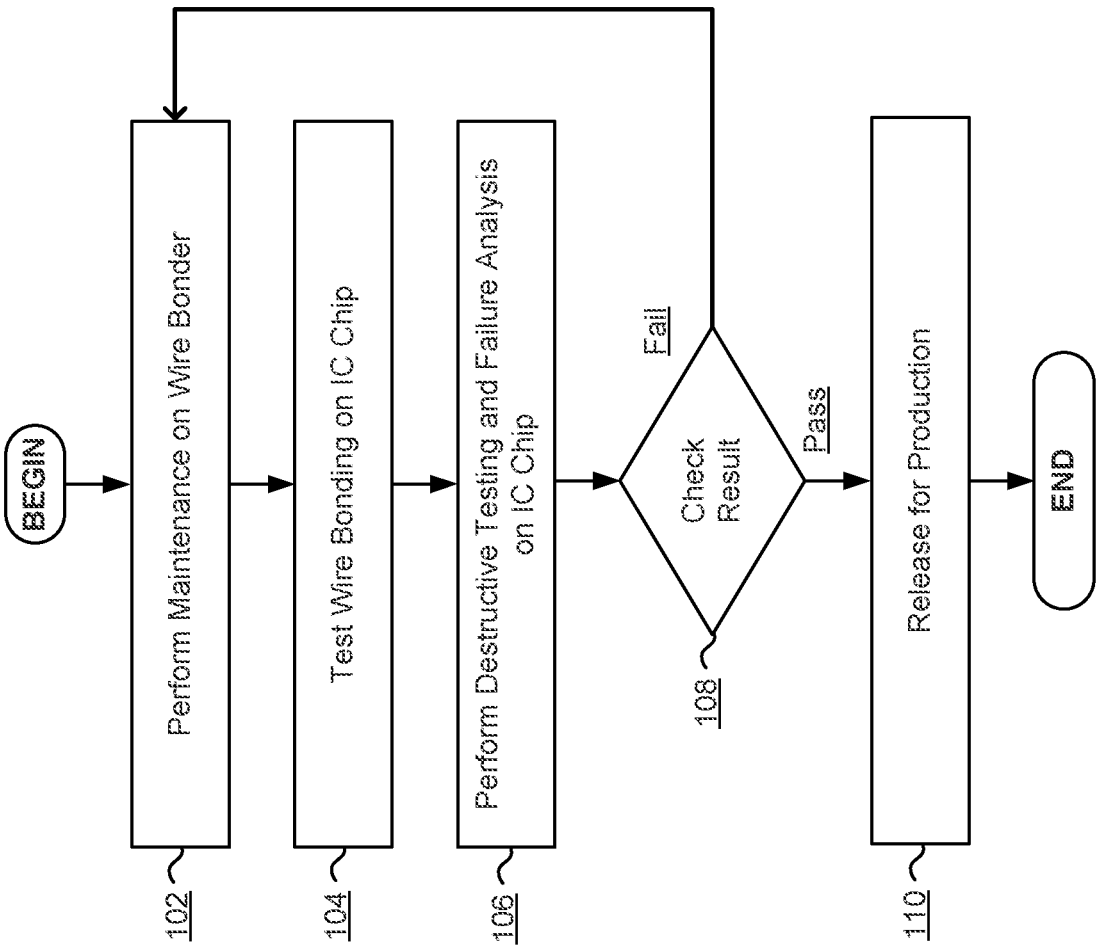
FIG. 1 illustrates a conventional IC test flow according to the prior art.

Throughout this description numerous details are set forth in order to provide a thorough understanding of the various embodiments in this disclosure, which are provided as illustrative examples so as to enable those of skill in the art to practice the embodiments. It will be apparent to those skilled in the art that the techniques described in this disclosure may be practiced without some of these specific details, or in other instances, well-known structures and devices may be shown in block diagram form to avoid obscuring the principles and techniques described in this disclosure. The drawings and examples provided in this disclosure are not intended to limit the scope to any single embodiment, but other embodiments are possible by way of interchange of some or all of the described or illustrated elements.

Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. Moreover, applicants do not intend for any in the specification or claims to be ascribed an uncommon or special meaning unless explicitly set forth as such. Further, the scope encompasses present and future known equivalents to components referred to herein by way of illustration.

The embodiments disclosed herein can also be used in processes for micro-quality control using failure detection and analysis. Wafer testing and final testing alone cannot reduce early phase failures acceptably. A data collection system as disclosed herein can dramatically reduce the risk of the early failure, changing the paradigm from macro-quality control to micro-quality control.

In the described embodiments a machine-learning type system can be utilized in order to enable highly repeatable and accurate classification into abnormal and normal looking IC chips, as well as to identify suspected data collection problems. The basic process is to present an initial training data set to the machine learning system and teach it the correct outcome. By doing this, the machine heuristically learns how to classify the data such that when new data is presented to it, the classification will be done properly. There are many known machine-learning systems/algorithms that can be used to enable this process, such as neural networks, support vector machines, linear regression analysis, etc.

As a further challenge to this classification, it must be done very fast and often on-line (e.g., less than 1 second between data collection and classification). If the classification is performed properly, it is possible to identify chips that appear normal as far as the data collection is concerned and those which look abnormal. In one embodiment, distinguishing normal chips from the ones that appear abnormal can be accomplished based on variations in the shape of the circuit traces (e.g., during stable periods) rather than the absolute value of the circuit traces. The identified abnormal chips can then be either discarded or subjected to various (additional) torture tests to ensure the quality. Normal chips can be shipped to customers.

As an extension of the above, it is also possible to increase the efficiency of many tools in back-end assembly and testing. Tools require maintenance at regular intervals. After maintenance, the machine state needs to be confirmed prior to placing the machine back into production. Often, this can be performed using destructive testing. Unfortunately destructive testing and failure analysis on test bonds takes a significant amount of time. This time is lost production time. By using the system described herein, it is possible to reduce this down time significantly.

By using FDC data on test bonding it can be seen whether the tool is suitable for release to production. If abnormal looking FDC data is being generated it can be deduced that the maintenance was not successful on the wire bonder and it needs to be re-performed or otherwise adjusted. Of course occasional destructive testing after maintenance is still necessary to be absolutely certain, but it can be done far less frequently. Since the process using FDC data as described in the embodiments herein is an almost instantaneous process, the result can be a significant decrease in down time of the equipment.

Illustrative Processes

The following figures depict flow charts illustrating various example embodiments of a process for using failure detection data for testing wire bonds on an IC chip in accordance with the techniques described in this disclosure. It is noted that the processes described below are exemplary in nature and are provided for illustrative purposes and not intended to limit the scope of the disclosure to any particular example embodiment. For instance, methods in accordance with some embodiments described in this disclosure may include or omit some or all of the operations described below, or may include steps in a different order than described in this disclosure. The particular methods described are not intended to be limited to any particular set of operations exclusive of all other potentially intermediate operations. In addition, the operations may be embodied in computer-executable code, which may cause a general-purpose or special-purpose computer hardware to perform operations. In other instances, these operations may be performed by specific hardware components or hardwired circuitry, or by any combination of programmed computer components and custom hardware circuitry.

Figure 2:
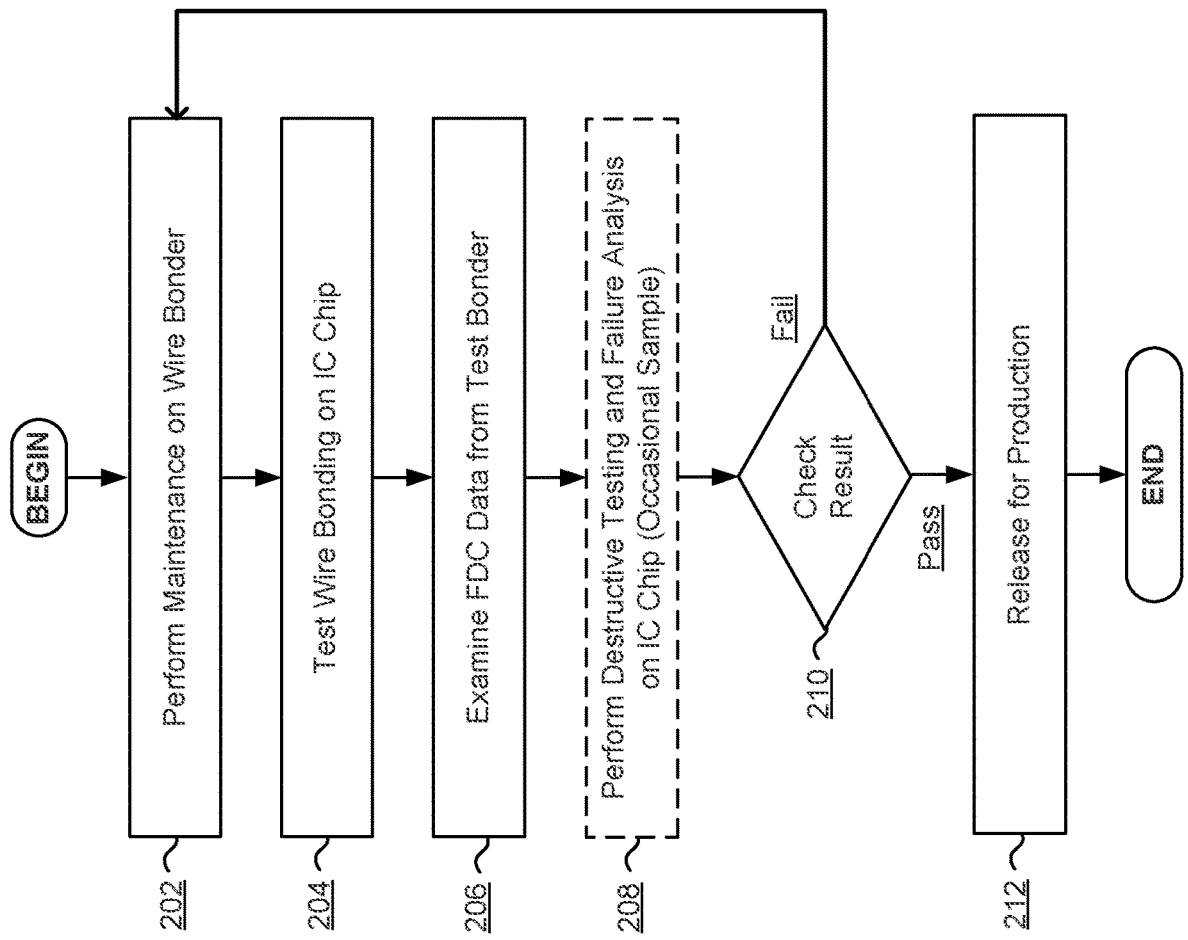
FIG. 2 illustrates an example embodiment of an IC test flow in in accordance with the techniques taught in this disclosure.

FIG. 2 illustrates an example IC test flow in in accordance with the teachings of the present disclosure. In the illustrated embodiment process 200 begins at operation 202 where maintenance has been performed on the wire bonder (or other machine used in the backend assembly process—see FIG. 3 below). After maintenance has been performed on the wire bonder, the wire bonding on the IC chip can be tested (operation 204) by examining the failure detection data (e.g., FDC data) that is received from the wire bonder (operation 206). As discussed, destructive testing and failure analysis can occasionally be performed on the IC chip (operation 208—*optional), but this can be done far less frequently using the failure detection data than the prior art methods. The effectiveness of the result can then be evaluated (operation 210), and if the testing is determined to have failed, the process repeats at operation 202. If the testing passes, the integrated circuit ("IC") chip can be released for production (operation 212). This completes process 200 according to one example embodiment.

Illustrative Systems

Provided below is a description of an example system upon which the embodiments described in this disclosure may be implemented. Although certain elements may be depicted as separate components, in some instances one or more of the components may be combined into a single device or system. Likewise, although certain functionality may be described as being performed by a single element or component within the system, the functionality may in some instances be performed by multiple components or elements working together in a functionally coordinated manner.

In addition, hardwired circuitry may be used independently or in combination with software instructions to implement the techniques described in this disclosure. The embodiments described in this disclosure are not limited to any specific combination of hardware or software. For example, the described functionality may be performed by custom hardware components containing hardwired logic for performing operations, by general-purpose computer hardware containing a memory having stored thereon programmed instructions for performing operations, or by any combination of computer hardware and programmed components. The embodiments may also be practiced in distributed computing environments, such as in a private or public cloud network, where operations may be performed by remote data processing devices or systems that are in communication with one another through one or more wired or wireless networks.

Figure 3:
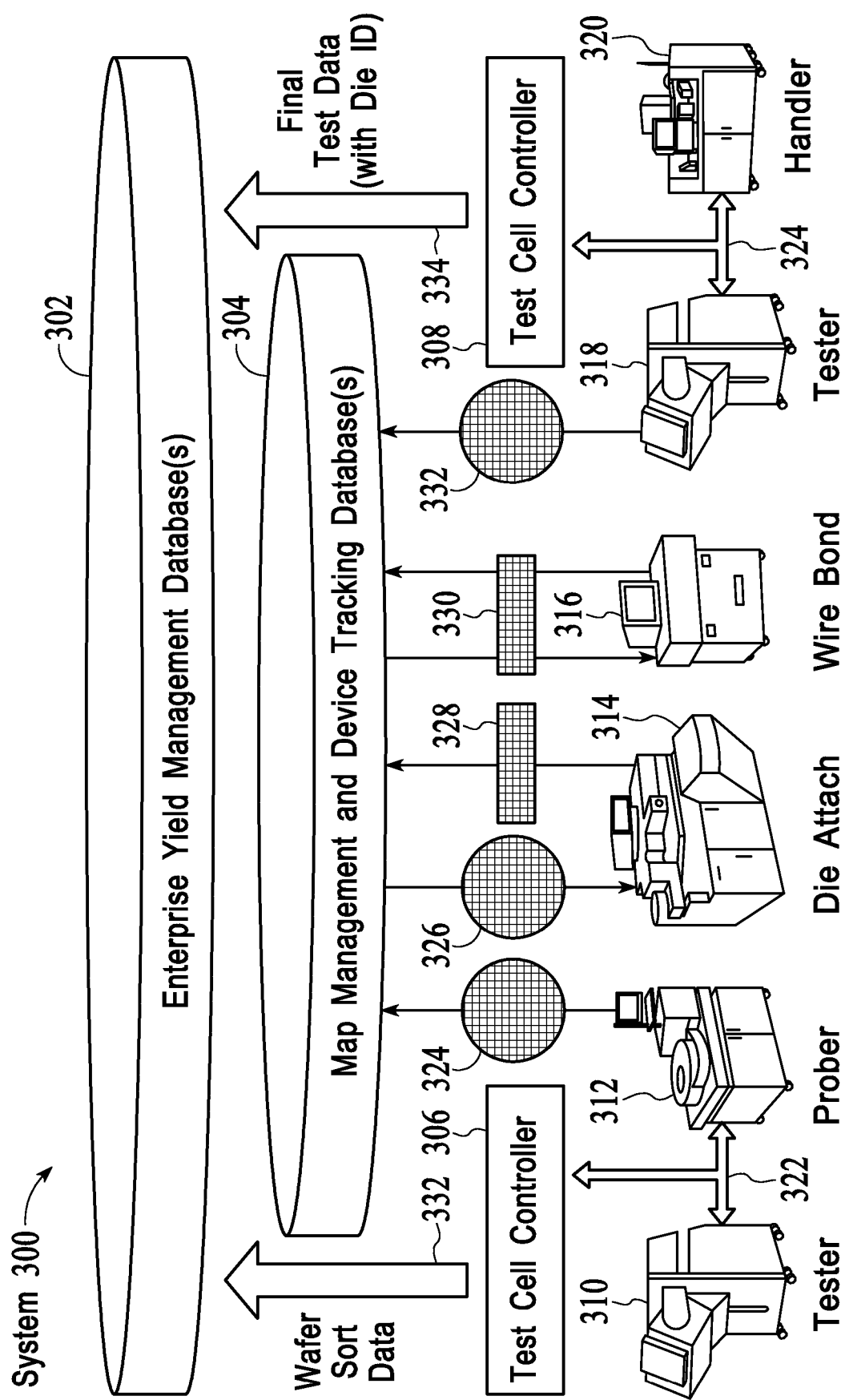
FIG. 3 illustrates an example embodiment of a system for IC yield management.

FIG. 3 illustrates an example embodiment of a system for IC yield management according to the techniques described in this disclosure. In the illustrated embodiment, an enterprise yield management database(s) 302 and a map management and device tracking database(s) 304 are in communication with machinery typically used in a backend IC chip assembly process, including testers 310 and 318, a prober 312, a die attach 314, a wire bonder 316, and a handler 320. The test controller 306 communicates with the tester 310 and prober 312 over one or more wired or wireless network connection 322 to provide wafer sort data 332 to the enterprise yield management database(s) 302 as shown. The prober also provides wafer data 324 to the map management and device-tracking database(s) 304, which provides mapping and other wafer data 326 to the die-attach machinery 314.

Unlike front-end processing, there is no lot/wafer/die-x/die-y data to track every step in the process. During assembly the wafers may be diced and put into trays. They can then be die attached onto potentially a different tray/strip. The die attach machinery 314 provides the diced wafers in a first tray 328 to the map management and device-tracking database(s) 304. In one embodiment, the x and y coordinates of each of the dice on the wafer can be transferred to the corresponding locations on the first tray 328 before sending to the map management and device-tracking database(s) 304 using device identification numbers ("IDs"). For collecting failure detection data according to the techniques described herein, it may be necessary to map every step to track where each lot, wafer, and die came from.

The wire bonding can then be performed by the wire bonder 316. The die can be bonded onto potentially yet another different tray 330 and stored to the map management and device tracking database(s) 304. The test controller 308 is in communication with the tester 318 and the handler 320 via one or more wired or wireless network connections 324. Wafer maps 332 can be regenerated and the wafers can then be finally singulated and tested. Final test data 334 (with Die ID) can then be stored to the enterprise yield management database(s) 302.

Figure 4:
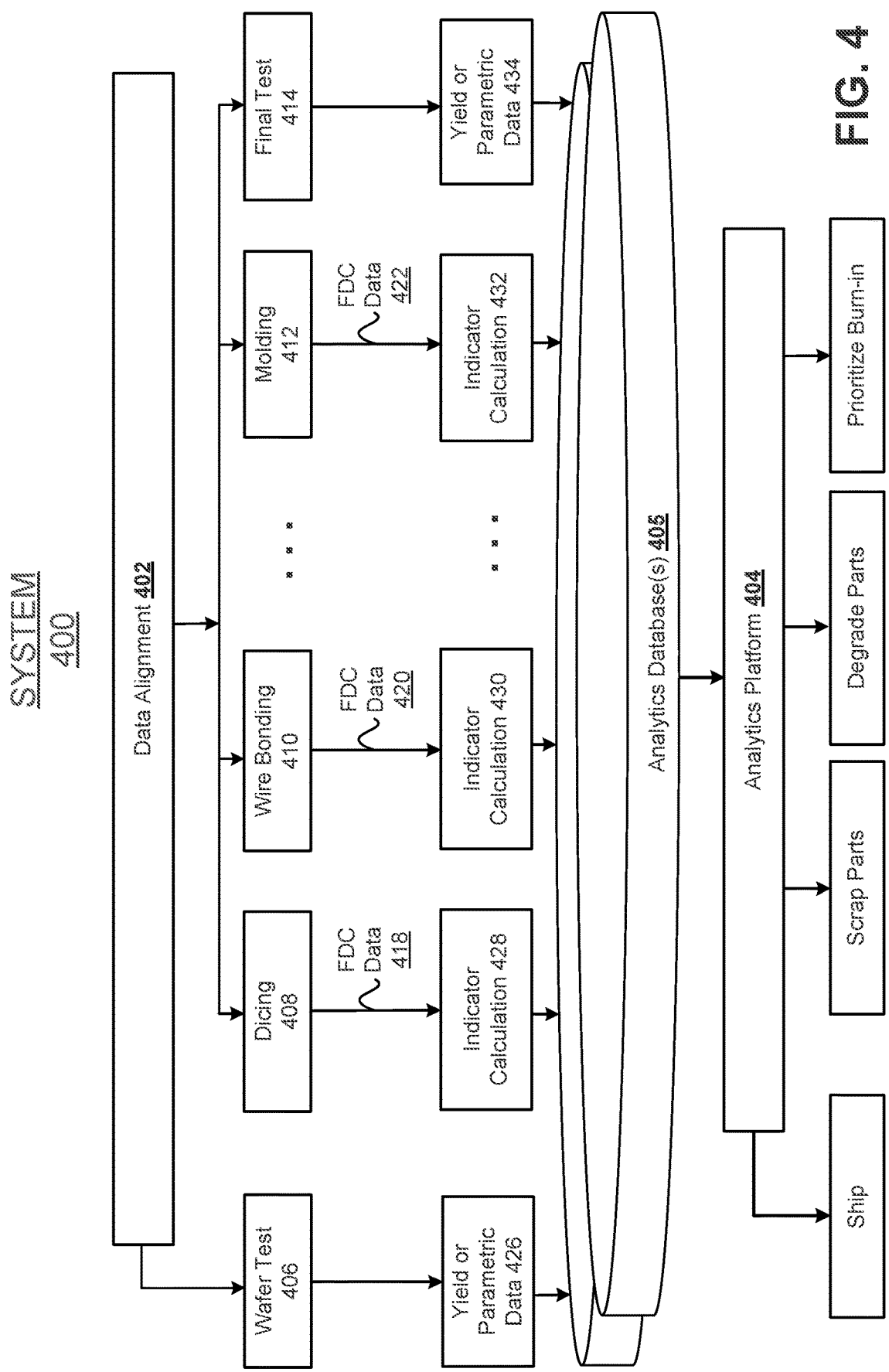
FIG. 4 illustrates an example embodiment of a test system for including a software database in accordance with the techniques taught in this disclosure.

FIG. 4 illustrates an example test system for including a software database in accordance with the techniques described herein. In the illustrated embodiment, system 400 includes a data alignment block 402, one or more analytics databases 405 and a data analytics platform 404 in communication therewith. The data alignment block 402 further includes wafer test block 406, a dicing block 408, wire-bonding block 410, modeling block 412, and a final test block 414. There could be more blocks depending the tests to be performed.

In the illustrated embodiment of system 400, the yield or parametric data 426 can be output from the wafer test block 406 and provided to the database(s) 405 via interconnection 416, the indicator calculation data 428 which includes FDC data 418 can be output from dicing 408 and provided to the analytics database(s) 405, the indicator and calculation data 430 which includes FDC data 420 can be output from the wire bonder 410 can be provided to the analytics database(s) 405, the indicator calculation data 432 output from the molding block 412 can be provided to the analytics database (s) 405, and finally, the yield or parametric data 434 output from the final test block 414 can be provided to the analytics database(s) 405. The output of the analytics database(s) 405 can then be provided to the analytics platform 404 for processing.

Finally, the data is analyzed in order to determine whether the part should be shipped or whether it is of questionable quality (in which case it is either scrapped, downgraded, or submitted to a burn-in torture test). The analytics platform 404 can compute the information received from one or more analytics databases 405 to determine whether to ship the IC parts, degrade the parts, use them for scrap parts, or prioritize burn-in for those parts. In this embodiment, first, the FDC data can be collected at each step of the assembly process such as wire-bonding, die-attach, die-molding, etc. Then, the data is stored and aligned using the data alignment block 402. Data alignment can be very difficult in the assembly process because the parts change organization and structure at each step along the way. An "Exensio" database, "ALPS" database, or other such database, may be utilized to align this data and control traceability.

Failure detection data collection in backend assembly and test is in many ways harder than the traditional wafer processing because the data volume can be voluminous. Take the wire-bonding process as an example—in such case, one bond takes about 60 milliseconds (ms) and a sampled is measured every 250 microseconds (s) or less. Since there can be millions of parts running through a factory in a day and several thousand tools processing them, the data volume can become enormous. Furthermore, this data often needs to be retained for months or years at a time in order for control quality. Taking the wire bonding process as an example, over a billion bonds can be made in a single day. Out of those billions of bonds only tens or hundreds will be questionable, so the problem emerges as looking for the proverbial needle in a haystack.

Figure 5:
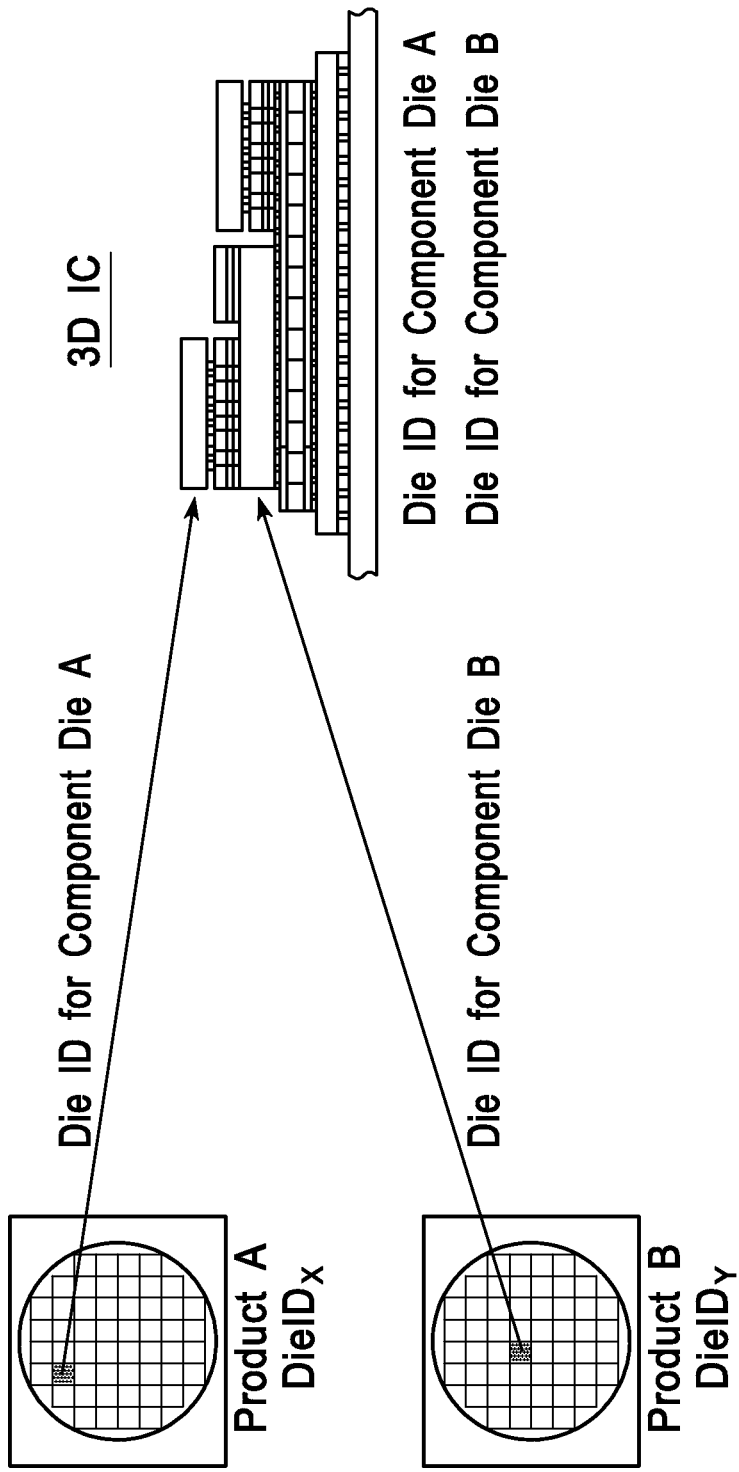
FIG. 5 illustrates an example embodiment of a product lifecycle analysis that can be performed using the database of FIG. 4.

FIG. 5 illustrates an example product lifecycle analysis that can be performed using the database of FIG. 4. As shown the Die IDs for components A and B are tracked from the component die to the integrated circuit (shown as a cross section). Existing database functionality can enable across-product-lifecycle features, for holistic approach to control, diagnostics and predictability. Die level traceability enables tracking of individual die throughout the manufacturing and assembly process flows. Lot genealogy enables tracking of wafers through manufacturing, sort and final test. Huge flexibility in datatypes can be loaded to enable the analysis across product lifecycles.

Figure 6:
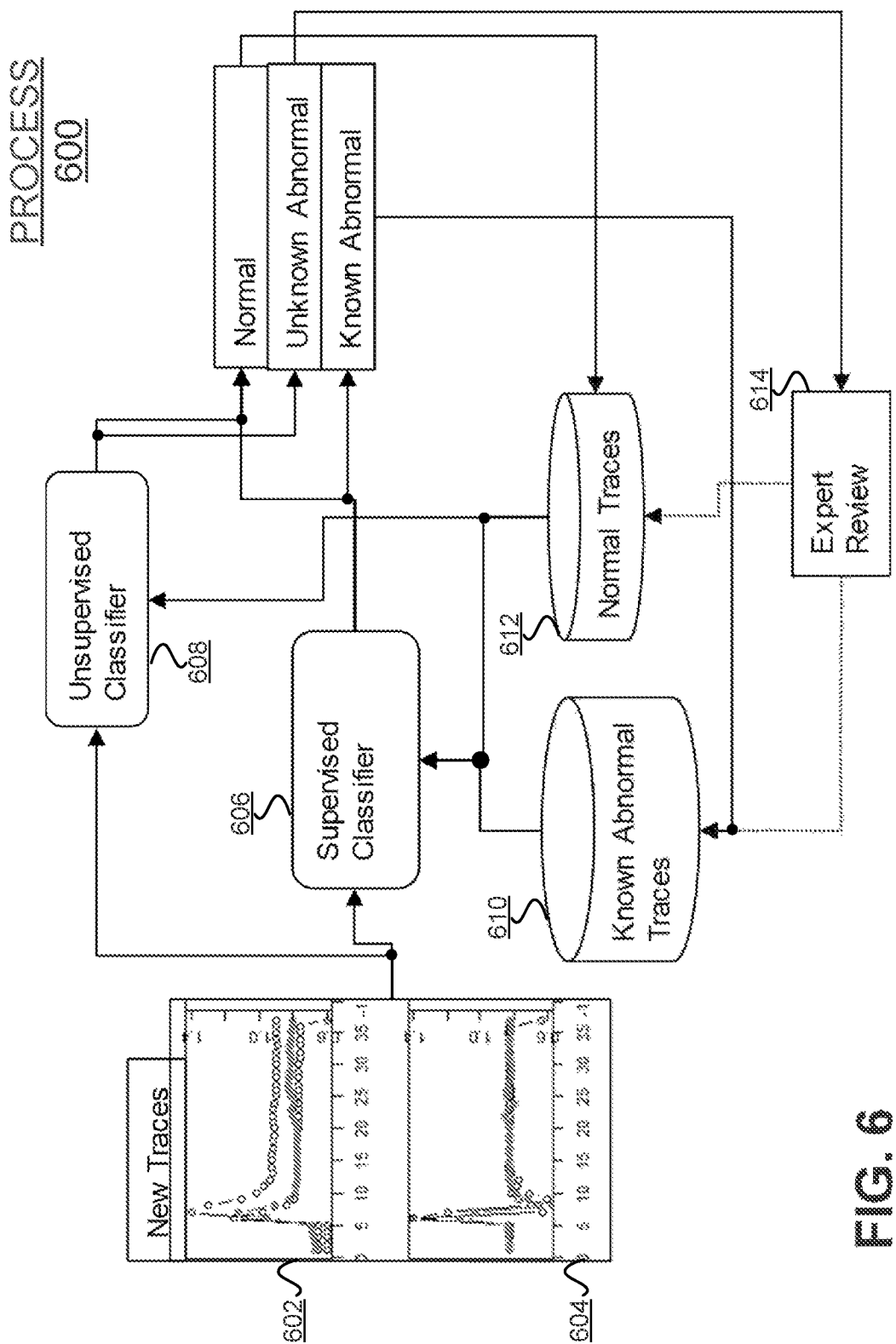
FIG. 6 illustrates an example embodiment of a data flow diagram for classification of circuit traces.

FIG. 6 illustrates an example embodiment of a data flow diagram for classification of circuit traces. Identifying faults in wire-bonding traces, or in general any equipment traces, should include both supervised and unsupervised (or one-class) trace classification methods. Unsupervised or one-class classification methods can be used to identify abnormal traces that are not similar to previously observed bad traces. Supervised classification methods can identify abnormal traces that are similar to previously observed traces. Supervised classification methods are generally more accurate than unsupervised methods and have the advantage of providing more useful information that simply an abnormal designation, but cannot reliably identify previously unobserved abnormalities.

In the illustrated embodiment of process 600, new traces 602, 604 are received at a supervised classifier 606 and an unsupervised classifier 608. Abnormal traces are distinguished from normal traces by variation in trace shape during stable periods rather than the absolute value of the trace. Because of this, transformations of the original traces are often very valuable for failure detection data for wire bonding (or in general any equipment traces). One such transformation is taking the first difference of the original trace, although others are possible.

There are many potential different methods for Unsupervised Classification and some ensemble approach is probably warranted. Specific methods include (1) detecting limits on principal components based on training data (2) approximate new traces using principal components of training data and detect abnormal residuals limits from training data (3) approximate new traces using neural network auto-encoders and detect abnormal residuals using limits from training data (4) self organizing maps ("SOMs") or other clustering algorithms (5) one-class neural networks, or (6) combinations of these various algorithms.

Supervised classification methods also have a variety of possible algorithms. In general, any of the myriad machine learning algorithms can be used for this purpose. Our current favorite is an ensemble of 1-dimensional convolved neural networks and a densely connected neural network on trace indicators. Many other options are possible.

Once the normal traces are identified, they can be stored in a database 612. Known abnormal traces can be stored in a database 610 comprising known abnormal traces. And for abnormal traces that are unknown, expert review 614 may be required, and then the results of that provided to the databases 610 or 612 depending on the traces.

It should be readily apparent to those of ordinary skill in the art that various changes, modifications and substitutes are intended to the embodiments described herein, within the form and details thereof, without departing from intended spirit and scope. Accordingly, it will be appreciated that in numerous instances some features will be employed without a corresponding use of other features. Further, those skilled in the art will understand that variations can be made in the number and arrangement of components illustrated in the above figures.

What is claimed is:

1. A method of testing wire bonds for an integrated circuit (IC) chip in an assembly process comprising:
   at a data collection system comprising a computer hardware server in communication with a database system over a computer network:
   receiving, over the computer network, a collection of failure detection data for one or more test samples of the IC chip obtained during wire bonding in the assembly process;
   performing a failure detection process on the collection of failure detection data to evaluate the test samples of the IC chip, the failure detection process comprising:
   (a) training a machine learning algorithm using a training dataset comprising at least a portion of the collection of failure detection data stored in the database system;

(b) detecting, by the machine learning algorithm, failure indicators in the test samples of the IC chip based on the collection of failure detection data;

(c) identifying, by the machine learning algorithm, circuit traces on a surface of each test sample of the IC chip as abnormal circuit traces when one or more failure indicators are detected; and (d) identifying, by the machine learning algorithm, circuit traces on the surface of each test sample of the IC chip as normal circuit traces when no failure indicators are detected; and (e) identifying, by the machine learning algorithm, test samples of the IC chip that contain no traces identified as abnormal circuit traces as normal IC chips, wherein trace data for the circuit traces identified as normal circuit traces are stored into a data structure of normal IC chips.

2. The method of claim 1 further comprising segregating abnormal IC chips or subjecting them to additional destructive tests in the assembly process.

3. The method of claim 1 further comprising:
receiving new or updated failure detection data; and
classifying, by the machine learning algorithm, the new or updated failure detection data as either normal trace data or abnormal trace data based on comparing it with the trace data for the normal IC chips stored in the data structure.

4. The method of claim 1 wherein the failure detection data is used to improve throughput of the process or burn-in reduction.

5. The method of claim 1 further comprising performing a manual destructive test on a subset of the test samples of the IC chip in addition to the failure detection process.

6. The method of claim 1 further comprising skipping a destructive test in the assembly process for the normal IC chips.

7. The method of claim 1 further comprising reducing destructive testing in the assembly process for the normal IC chips.

8. The method of claim 7 wherein the destructive testing comprises a burn-in process in a thermal chamber adapted to stress circuit traces in IC chips for failure analysis.

9. The method of claim 8 wherein the burn-in process is reduced by applying the burn-in process to the normal IC chips for less time than for IC chips having abnormal circuit traces.

10. The method of claim 1 wherein the machine learning algorithm is selected from a group of machine learning algorithms consisting of: linear regression, neural network, or support vector algorithm.

11. A system comprising:
a processor;
a database system;
a network interface for communications over a computer network; and
a memory for storing computer code executable by the processor for performing operations for testing wire bonds for an integrated circuit (IC) chip in an assembly process, the operations comprising:

receiving, over the computer network, a collection of failure detection data for one or more test samples of the IC chip that was obtained during wire bonding in the assembly process;

performing a failure detection process on the collection of failure detection data to evaluate the test samples of the IC chip, the failure detection process comprising:

(a) training a machine learning algorithm using a training dataset comprising at least a portion of the collection of failure detection data stored in the database system;

(b) detecting, by the machine learning algorithm, failure indicators in the test samples of the IC chip based on the collection of failure detection data;

(c) identifying, by the machine learning algorithm, circuit traces on a surface of each test sample of the IC chip as abnormal circuit traces when one or more failure indicators are detected; and (d) identifying, by the machine learning algorithm, circuit traces on the surface of each test sample of the IC chip as normal circuit traces when no failure indicators are detected; and (e) identifying, by the machine learning algorithm, test samples of the IC chip that contain no traces identified as abnormal circuit traces as normal IC chips, wherein trace data for the circuit traces identified as normal circuit traces are stored into a data structure of normal IC chips.

12. The system of claim 11 wherein the operations further comprise subjecting abnormal IC chips to additional destructive tests in the assembly process.

13. The system of claim 11 wherein the operation further comprise:
receiving new or updated failure detection data; and
classifying, by the machine learning algorithm, the new or updated failure detection data as either normal trace data or abnormal trace data based on comparing it with the trace data for the normal IC chips stored in the data structure.

14. The system of claim 11 wherein the failure detection data is used to improve throughput of the process or burn-in reduction.

15. The system of claim 11 further comprising performing a manual destructive test on a subset of the test samples of the IC chip in addition to the failure detection process.

16. The system of claim 11 wherein the operations further comprise skipping a manual destructive test in the assembly process for the normal IC chips.

17. The system of claim 11 wherein the operations further comprise reducing destructive testing in the assembly process for the normal IC chips.

18. The system of claim 17 wherein the destructive testing comprises a burn-in process in thermal chamber.

19. The system of claim 18 wherein burn-in is reduced by applying the burn-in process to the normal IC chips for less time than for IC chips having abnormal circuit traces.

20. The system of claim 11 wherein the machine learning algorithm is selected from a group of machine learning algorithms consisting of: linear regression, neural network, or support vector.

* * * * *